United States Patent [19]

Oue et al.

[11] Patent Number: 5,038,129

[45] Date of Patent: Aug. 6, 1991

[54] ELECTROMAGNETIC HAVING MAGNETIC SHIELD

[75] Inventors: Tatsuya Oue; Yuji Shimada, both of Ako City, Japan

[73] Assignee: Mitsubishi Denki Kabushiki Kaisha, Japan

[21] Appl. No.: 605,426

[22] Filed: Oct. 30, 1990

[30] Foreign Application Priority Data

Nov. 1, 1989 [JP] Japan .................................. 1-286177

[51] Int. Cl.$^5$ ............................................. H01F 7/00
[52] U.S. Cl. ..................................... 335/301; 324/318
[58] Field of Search ....................... 335/214, 301, 304; 324/318, 319, 320

[56] References Cited

U.S. PATENT DOCUMENTS 4,800,355 1/1989 Takechi et al. ....................... 335/301
4,942,379 7/1990 Ogawa et al. ........................ 335/301

FOREIGN PATENT DOCUMENTS 0223706 9/1989 Japan .................................. 335/301

Primary Examiner—George Harris
Attorney, Agent, or Firm—Leydig, Voit & Mayer

[57] ABSTRACT

An electromagnet having a magnetic shield, in which dummy holes generally equal in shape to a hole conventionally provided for a service port are formed in a pair of end plates of a magnetic shield. The holes formed in each of the end plates are in equal radial-direction positions and are arranged in the circumferential direction at equal angular intervals, and the positions of the holes formed on the two end plates are symmetric on the center point of the electromagnet and/or the plane containing the center point and perpendicular to the center axis. Portions of the end plates in the vicinity of the holes are increased in thickness to compensate for the loss of the magnetic material due to the formation of the holes.

7 Claims, 2 Drawing Sheets

ELECTROMAGNETIC HAVING MAGNETIC SHIELD

BACKGROUND OF THE INVENTION

1. Field of the Invention

This invention relates to an electromagnet having a magnetic shield for use in a nuclear magnetic resonance diagnostic apparatus or the like and, more particularly, to a structure whereby a highly uniform magnetic field can be generated.

2 Description of the Related Art

FIG. 4 is a cross-sectional view of a conventional magnetically shielded electromagnet of this kind taken on a vertical plane containing the center axis thereof. For example, this electromagnet is constructed as a superconducting electromagnet. A coil 1 which generates a uniform-magnetic-field is formed by winding a superconducting wire so as to have a hollow cylindrical shape and to be symmetrical with respect to a center point 0 on the center axis CL. A cryostat 2 contains the uniform-magnetic-field coil 1 and a liquid helium 3 for cooling the uniform-magnetic-field coil 1 at an extremely low temperature to maintain this coil in a superconducting state. A magnetic shield 4 is arranged to surround the cryostat 2. The magnetic shield 4 has a hollow cylindrical yoke 5 formed of a magnetic substance, e.g., iron and having a center axis and a center point coinciding with the center axis CL and the center point 0, and a pair of end plates 61 and 62 also formed of a magnetic substance, e.g., iron. The end plates 61 and 62 are ring-like circular plates having generally central holes 61a and 62a respectively which have a diameter approximately equal to that of an inner cylindrical space 7 which is formed at the center of the magnet. A hole 8 is also formed in the end plate 61. A service port 2a extends through the hole 8. The service port 2a projects from one end of the cryostat 2 to outside of the magnetic shield 4 in order to guide a lead 1a for introducing a current to the coil 1 and to serve a piping for supplying the liquid helium 3, and the like.

In the thus-constructed electromagnet with the magnetic shield, when the uniform-magnetic-field coil 1 is energized in a superconducting condition, a magnetic flux is formed in the inner cylindrical space 7 in the direction of the Z-axis corresponding to the center axis CL. The greatest part of this magnetic flux circulates in a loop by flowing into the end plate 61 having a large relative magnetic permeability, flowing through the cylindrical yoke 5 in the direction opposite to that of the flow inside the inner cylindrical space 7 and returning into the inner cylindrical space 7 through the end plate 62. The magnetic shield 4 thereby limits the magnetic field leakage to the outside. A uniform magnetic field necessary for nuclear magnetic resonance diagnosis can be obtained in a spherical region 9 indicated by the broken line around the center point o in the inner cylindrical space 7.

The shape of the magnetic shield 4 and so on, as well as the coil 1, influence the magnetic field generated in the spherical region 9. It is therefore necessary for the magnetic shield 4 to have a strictly symmetrical structure.

In the conventional magnetically shielded electromagnet, specifically, in the construction of the magnetic shield 4, the magnetic resistance is locally increased at the hole 8 owing to the existance of this hole 8 formed in the end plate 61, and non-uniform magnetic field gradient components is generated in the spherical region 9 because of this asymmetric construction.

These conditions will be described below in more detail. Assuming rectangular coordinate axes X, Y and Z as shown in FIG. 4, and assuming that the hole 8 formed in the end plate 61 is located on, for example, the Y-axis, components relating to the Z- and Y-axes, i.e., magnetic field gradient components represented by functions of Z, Y, ZY, $Z^2Y$ and the like occur. If the hole 8 is located on the X-axis, components relating to the Z- and X-axes, i.e., magnetic field gradient components represented by functions of Z, X, ZX, $Z^2X$ and the like appear. If the hole 8 is located at a position on the X-Y plane excepting on each axis, magnetic field gradient components represented by a function of Z, X, Y, ZX, ZY, XY, $X^2-Y^2$, $Z^2X$, $Z^2Y$, ZXY and the like are generated.

The conventional electromagnet therefore requires a magnetic field compensation means for removing the non-uniform magnetic components caused by the hole 8. More specifically, it is necessary to add various types of magnetic field compensation coils and to increase the output to enable magnetic field compensation.

A problem relating to magnetic attraction between the uniform-magnetic-field coil 1 and the magnetic shield 4 is also encountered. That is, the magnetic attraction force acting from the center point 0 toward the hole 8 is smaller than the magnetic attraction force acting in the opposite direction, and the uniform-magnetic-field coil 1 is attracted in the direction from the hole 8 to the center point 0. It is therefore necessary to reinforce the support for maintaining the uniform-magnetic-field coil 1 in the normal position A complicated and expensive support structure is therefore required.

SUMMARY OF THE INVENTION

In view of these problems, an object of the present invention is to provide an electromagnet having a magnetic shield capable of reducing non-uniform magnetic field components caused by a hole formed in one end plate of the magnetic shield.

In order to achieve the above object, according to the present invention, there is provided an electromagnet having a magnetic shield, comprising: a uniform-magnetic-field coil means formed into a hollow cylindrical shape to generate a uniform static magnetic field therein; at least one service port for connection between the uniform-magnetic-field coil means and an external unit; and a magnetic shield arranged to surround the uniform-magnetic-field coil means, the magnetic shield having a cylindrical yoke formed of a magnetic substance and having a center axis and an axial center point coinciding with those of the uniform-magnetic-field coil means, and a pair of magnetic end plates connected to opposite ends of the cylindrical yoke, at least one of the end plates having a first hole through which the service port extends; wherein the pair of end plates have second holes generally equal in shape with each other and with the first hole, the first and second holes formed in each of the end plates are in equal radial-direction positions and are arranged in the circumferential direction at equal angular intervals, and the positions of the first and second holes formed in one of the end plates and the positions of the first and second holes formed in the other of the end plates are symmetric on the center point and/or the plane containing the center point and perpendicular to the center axis.

In the electromagnet having the magnetic shield in accordance with the present invention, dummy holes generally equal in shape to a hole conventionally provided for a service port are formed in a pair of end plates of a magnetic shield. The holes formed in each of the end plates are in equal radial-direction positions and are arranged in the circumferential direction at equal angular intervals, and the positions of the holes formed one of the two end plates and the positions of the holes formed in the other end plate are symmetric on the center point of the electromagnet and on the plate containing the center point and perpendicular to the center axis.

The dummy holes have the same magnetic characteristics as the hole conventionally provided, and all the holes are arranged in the two end plates in symmetric positions. Non-uniform magnetic field components are thereby reduced.

DESCRIPTION OF THE PREFERRED EMBODIMENTS

Figure 1:
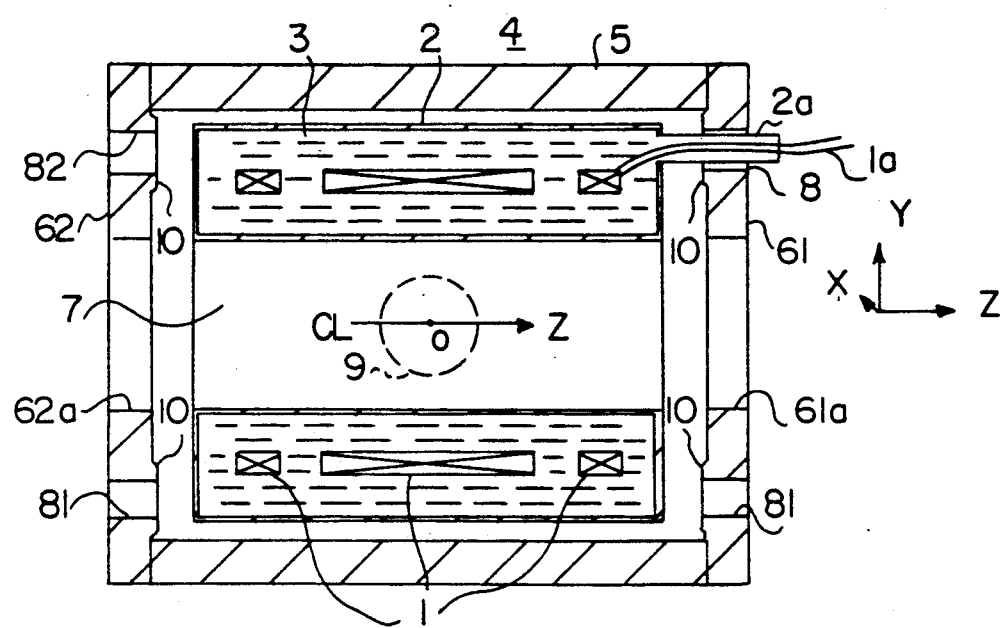
FIG. 1 is a cross-sectional view of an electromagnet having a magnetic shield in accordance with an embodiment of the present invention.
Figure 2:
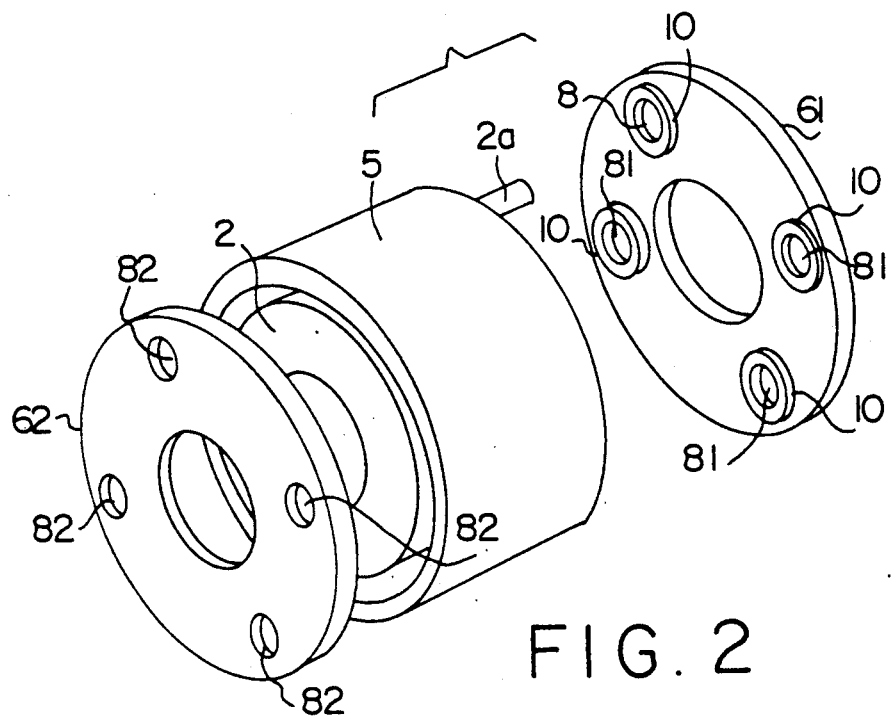
FIG. 2 is a perspective view of the electromagnet shown in FIG. 1, in which end plates are removed.

FIG. 1 is a cross-sectional view of a magnetically shielded electromagnet in accordance with an embodiment of the present invention taken on a vertical plane containing the center axis thereof, and FIG. 2 is a perspective view of the electromagnet shown in FIG. 1, in which end plates 61 and 62 of a magnetic shield 4 shown in FIG. 1 are removed. A uniform-magnetic-field coil 1, a cryostat 2, liquid helium 3 provided as a coolant constitute a uniform-magnetic-field means. The ends plates 61 and 62 of the magnetic shield are different from those of the conventional electromagnet That is, in the end plate 61, three second holes 81 are formed while a first hole 8 through which a service port 2a of the cryostat extends is formed as in the case of the conventional arrangement (In this specification the second holes are referred to as dummy holes because they do not serve for extension of any service port through the end plate but are formed to make the magnetic field uniform as described later ) Each hole 81 has the same shape as the hole 8 and is positioned at the same radial distance from the center of the end plate 61 as the hole 8. The holes 81 and the hole 8 are arranged in the circumferential direction at equal intervals of 90°.

Second holes, i.e., dummy holes 82 are also formed in the end plate 62. The holes 82 are formed in positions respectively symmetric with those of the holes 8 and 81 formed in the end plate 61 on the center point 0. At the same time, the positions of the hole 82 and the positions of the holes 8 and 81 are symmetric on the plane containing the center point 0 and perpendicular to the center axis CL.

The end plates 61 and 62 have thicker portions 10 formed of a magnetic substance and integrally formed around the holes 8, 81, and 82.

In this embodiment, the generation and the flow of a magnetic field formed by the uniform-magnetic-field coil 1 are basically the same as the conventional arrangement In this embodiment, however, the dummy holes 81 and 82 having the same magnetic characteristics as the hole 8 are formed along with the hole 8 which causes a non-uniform magnetic field. The conditions for symmetrization of the construction of the magnetic shield 4 are satisfied by the overall effects of the holes 81 and 82 and the hole 8.

Consequently, occurrence of non-uniform magnetic field components in the spherical region 9 is limited, the need for magnetic field compensation means is therefore eliminated or reduced, and the increase in the output required to enable magnetic field correction is reduced or becomes unnecessary. Also, the magnetic attraction between the uniform-magnetic-field coil 1 and the magnetic shield 4 is balanced and the structure for supporting the uniform-magnetic-field coil 1 can be simplified.

However, since the number of holes which increase the magnetic resistance is increased, the essential functions of the magnetic shield 4 are impaired to a certain extent. The thicker portion 10 are provided for the purpose of solving this problem. The loss of the magnetic substance due to the hole 8 and so on is compensated by the thicker portions 10 formed around the holes, so that the magnetic path sectional area and the desired magnetic performance necessary for the magnetic shield 4 are maintained, thereby ensuring a sufficient shielding capacity.

Figure 3:
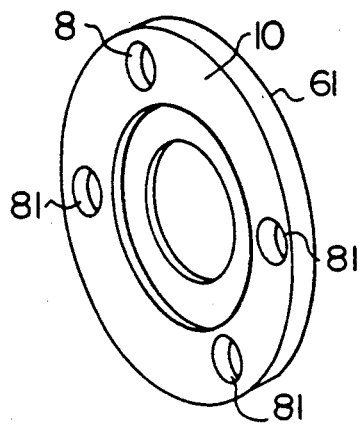
FIG. 3 is a perspective view of an end plate in accordance with another embodiment of the present invention.
Figure 4:
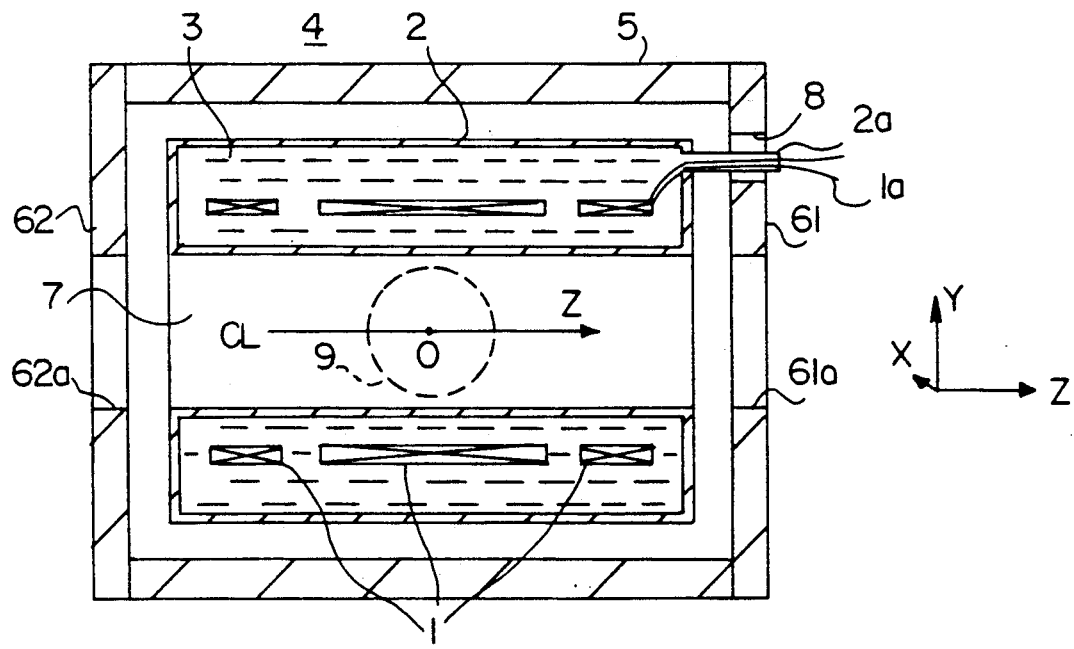
FIG. 4 is a cross-sectional view of a conventional electromagnet having a magnetic shield.

FIG. 3 is a perspective view of an end plate 61' in accordance with another embodiment of the present invention, more specifically, an example of a modification of the thicker portions 10 shown in FIG. 2. In this example, a ring-like portion 10' coaxial with the end plate 61' and having a certain radial width such as to include the holes 8', 81' formed instead of the thicker portions 10 shown in FIG. 2. This construction is advantageous in that the end plate 61' can be made and worked easily.

In the above-described embodiments, four holes are formed in each end plate. Alternatively, two, three, five or more holes may be formed so long as they are disposed in equal-radial-distance positions and are arranged in the circumferential direction at equal angular intervals. The provision of these holes enables a reduction in non-uniform magnetic field components in comparison with the conventional arrangement, although the reduction varies according to the number of holes. In the above-described embodiments, the service port 2a is provided at one end of the cryostat 2 However, the present invention can also be applied to electromagnets in which service ports 2a are provided at opposite ends of the cryostat 2. In this case, another hole 8 is formed in the end plate 62 and the service port is led out through this hole.

Ordinarily, if the holes in the end plates 61 and 62 are disposed in positions symmetric on the center point 0, magnetic field gradient components of even orders (e.g., terms ZY, ZX and the like of the conventional arrangement) are cancelled out. In contrast, if these holes are disposed in positions symmetric on the plane containing the center point 0 and perpendicular to the center axis CL, magnetic field gradient components of odd orders (e.g , terms X, Y, $Z^2Y$ and the like) are cancelled out.

The above-described embodiments relates to a superconducting electromagnet, but the present invention is not limited to this type of electromagnet and can be applied to other types of electromagnets having magnetic shields in the same manner to obtain similar effects.

In accordance with the present invention, as described above, dummy holes having the same shape as the hole conventionally provided are formed in the end plates in predetermined symmetric positions, thereby enabling a symmetric magnetic shield construction and limiting occurrence of non-uniform magnetic field components. As a result, the need for a magnetic field compensation means is eliminated or reduced, and the increase in the output required to enable magnetic field correction is reduced or becomes unnecessary. Also an unbalanced magnetic attraction force applied to the uniform-magnetic field coil is reduced and the coil support structure can be simplified.

What is claimed is:

1. An electromagnet having a magnetic shield, comprising:
   uniform-magnetic-field coil means formed into a hollow cylindrical shape to generate a uniform static magnetic field therein;
   at least one service port for connection between said uniform-magnetic-field coil means and an external unit; and
   a magnetic shield arranged to surround said uniform-magnetic-field coil means, said magnetic shield having a cylindrical yoke formed of a magnetic substance and having a center axis and an axial center point coinciding with those of said uniform-magnetic-field coil means and a pair of magnetic end plates connected to opposite ends of said cylindrical yoke, at least one of said end plates having a first hole through which said service port extends;
   wherein said pair of end plates have second holes generally equal in shape to each other and to said first hole, said first and second holes formed in each of said end plates are in equal radial-direction positions and are arranged in the circumferential direction at equal angular intervals, and the positions of said first and second holes formed in one of said end plates and the positions of said first and second holes formed in the other of said end plates are symmetric on at least one of said center point and the plane containing said center point and perpendicular to said center axis.

2. An electromagnet having a magnetic shield according to claim 1 wherein portions of said end plates in the vicinity of said holes are increased in thickness so as to project inwardly to compensates for the loss of the magnetic material of said end plates due to the formation of said holes.

3. An electromagnet having a magnetic shield according to claim 2 wherein portions of said end plates surrounding said holes are increased in thickness so as to project inwardly to compensate for the loss of the magnetic material of said end plates due to the formation of said holes.

4. An electromagnet having a magnetic shield according to claim 2 wherein a ring-like portion of each of said end plates having a radial width such as to include portions in which said holes are formed, and coaxial with the end plate is increased in thickness so as to project inwardly to compensate for the loss of the magnetic material of said end plates due to the formation of said holes.

5. An electromagnet having a magnetic shield according to claim 1 wherein said electromagnet having a magnetic shield is a superconducting electromagnet; said uniform-magnetic-field coil means includes a uniform-magnetic-field coil formed into a hollow cylindrical shape by winding a superconducting wire, a coolant for maintaining said uniform-magnetic-field coil in a superconducting state, and a cryostat containing said coolant and said uniform-magnetic-field coil; and said service port, serves to introduce a current from the outside into said uniform-magnetic-field coil and to supply said coolant.

6. An electromagnet having a magnetic shield according to claim 1 wherein the positions of the plurality of holes formed in one of said end plates and the positions of the plurality of holes formed in the other of said end plates are symmetric on one of said center point and the plane containing said center point and perpendicular to said center axis.

7. An electromagnet having a magnetic shield according to claim 1 wherein the positions of plurality of holes formed in one of said end plates and the positions of a plurality of holes formed in the other of said end plates are symmetric on said center point and also symmetric on the plane containing said center point and perpendicular to said center axis.

* * * * *